US012666860B2

(12) United States Patent
She et al.

(10) Patent No.: US 12,666,860 B2
(45) Date of Patent: Jun. 23, 2026

(54) TETRADENTATE CYCLOMETALATED PLATINUM (II) COMPLEX BASED ON OXYGEN ATOM LINKAGE AND CONTAINING PHENYLACRIDINE AND APPLICATION THEREOF

(71) Applicants: Zhejiang University of Technology, Hangzhou (CN); Zhejiang Huaxian Photoelectricity Technology Co., Ltd., Jiaxing (CN)

(72) Inventors: Yuanbin She, Hangzhou (CN); Guijie Li, Hangzhou (CN); Gang Shen, Hangzhou (CN); Chunsong Zhou, Hangzhou (CN)

(73) Assignees: Zhejiang University of Technology, Hangzhou (CN); Zhejiang Huaxian Photoelectricity Technology Co., Ltd., Jiaxing (CN)

( * ) Notice: Subject to any disclaimer, the term of this patent is extended or adjusted under 35 U.S.C. 154(b) by 828 days.

(21) Appl. No.: 17/785,017

(22) PCT Filed: Jun. 10, 2021

(86) PCT No.: PCT/CN2021/099514
§ 371 (c)(1),
(2) Date: Jun. 13, 2022

(87) PCT Pub. No.: WO2021/249514
PCT Pub. Date: Dec. 16, 2021

(65) Prior Publication Data
US 2024/0188417 A1 Jun. 6, 2024

(30) Foreign Application Priority Data
Jun. 10, 2020 (CN) ......................... 202010521756.6

(51) Int. Cl.
*H10K 85/30* (2023.01)
*C07F 15/00* (2006.01)
*C09K 11/06* (2006.01)
*H10K 50/11* (2023.01)
*H10K 101/10* (2023.01)

(52) U.S. Cl.
CPC ....... *H10K 85/346* (2023.02); *C07F 15/0086* (2013.01); *C09K 11/06* (2013.01); *C09K 2211/1007* (2013.01); *C09K 2211/1014* (2013.01); *C09K 2211/1022* (2013.01); *C09K 2211/1029* (2013.01); *C09K 2211/185* (2013.01); *H10K 50/11* (2023.02); *H10K 2101/10* (2023.02)

(58) Field of Classification Search
CPC .......................... H10K 85/346; C07F 15/0086
See application file for complete search history.

(56) References Cited

U.S. PATENT DOCUMENTS

2014/0364605 A1 12/2014 Li et al.
2015/0105556 A1 4/2015 Li et al.
2015/0349279 A1* 12/2015 Li ........................ C07F 15/0086 252/301.16
2016/0233446 A1* 8/2016 Brooks .................. H10K 50/00
2019/0248820 A1* 8/2019 Li .......................... H10K 50/11

FOREIGN PATENT DOCUMENTS

CN 102898476 A 1/2013
CN 104232076 A 12/2014
CN 104693243 A 6/2015
CN 108409794 A 8/2018
CN 111574501 A 8/2020
CN 113735912 A * 12/2021 ............ C07F 15/006
(Continued)

OTHER PUBLICATIONS

G. Li et al., 59 Inorganic Chemistry, 18109-18121 (Nov. 26, 2020) (Year: 2020).*
(Continued)

*Primary Examiner* — Alexander R Pagano
(74) *Attorney, Agent, or Firm* — Nitin Kaushik

(57) ABSTRACT

The present invention relates to the technical field of organic light-emitting materials, and provides a tetradentate cyclometalated platinum (II) complex based on an oxygen atom linkage and containing phenyl acridine and an application thereof. The tetradentate cyclometalated platinum (II) complex has the structure as represented by general formula (I). (I) The cyclometalated platinum (II) complex in the present invention adopts a tetradentate ligand, is high in rigidity, and can improve the light stability of a light-emitting material. At the same time, the complex molecule can strongly emit light, and therefore can be used as a light-emitting material in an OLED device.

(I)

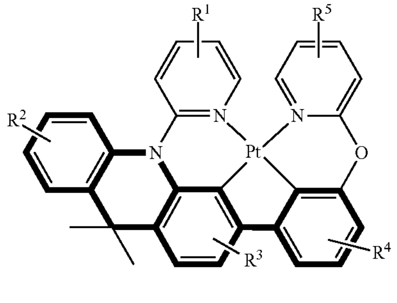

2 Claims, 3 Drawing Sheets

(56) References Cited

FOREIGN PATENT DOCUMENTS

EP 3547387 A1 10/2019

OTHER PUBLICATIONS

International Search Report dated Aug. 25, 2021, issued in connection with Int'l Application No. PCT/CN2021/099514, and English-language translation thereof (6 pages).
First Office Action issued Dec. 16, 2020, in connection with Chinese Patent Application No. 202010521756.6, and English-language translation thereof (12 pages).
Second Office Action issued May 6, 2021, in connection with Chinese Patent Application No. 202010521756.6, and English-language translation thereof (10 pages).
Li Guijie et al., "Phosphorescent Tetradentate Platinum(II) Complexes Containing Fused 6/5/5 or 6/5/6 Metallocycles," Inorganic Chemistry, vol. 59, Nov. 2020 (13 pages).
Li Guijie et al., "Highly Efficient Phosphorescent Tetradentate Platinum(II) Complexes Containing Fused 6/5/6 Metallocycles," Inorganic Chemistry, vol. 59, Feb. 2020 (12 pages).
Li Guijie et al., "Tetradentate Platinum(II) Complexes for Highly Efficient Phosphorescent Emitters and Sky Blue OLEDs," Chemistry of Materials, vol. 32, Dec. 2019 (12 pages).
Li Guijie et al., "Stable and efficient sky-blue organic light emitting diodes employing a tetradentate platinum complex," Applied Physics Letters, vol. 110, Mar. 2017 (6 pages).
European Search Report dated Dec. 17, 2023, issued by the European Patent Office in connection with European Patent Application No. 21822618.1 (6 pages).

* cited by examiner

TETRADENTATE CYCLOMETALATED PLATINUM (II) COMPLEX BASED ON OXYGEN ATOM LINKAGE AND CONTAINING PHENYLACRIDINE AND APPLICATION THEREOF

RELATED APPLICATIONS

This application is a U.S. National Phase Application under 35 U.S.C. 371 of International Application No. PCT/CN2021/099514 filed Jun. 10, 2021, which claims the benefit of Chinese Patent Application No. 202010521756.6 filed on Jun. 10, 2020. The disclosures of these applications are expressly incorporated herein by reference in their entireties.

TECHNICAL FIELD

The present disclosure relates to the technical field of organic light-emitting materials and, in particular, to a tetradentate cyclometalated platinum (II) complex based on oxygen atom linkage and containing phenyl acridine and an application thereof.

BACKGROUND

An organic light-emitting diode (OLED) is a self-luminous device without a backlight and has the advantages of a fast response speed, low energy consumption, high luminescence efficiency, a high contrast, a simple manufacturing process, mass production and the like. Light-emitting materials used in early devices are mainly organic micromolecular fluorescent materials. The spin-statistics quantum theory shows that in theory, a fluorescent material has an internal quantum efficiency of only 25%. In 1998, Professor Forrest of Princeton University discovered the electrophosphorescence phenomenon of metal organic complex molecule materials at room temperature. The strong spin-orbit coupling of heavy metal atoms can effectively promote the intersystem crossing of electrons from a singlet state to a triplet state. Therefore, an OLED device can make full use of all singlet and triplet excitons generated through electricity excitation so that the light-emitting material can achieve an internal quantum efficiency of 100% in theory (*Nature,* 1998, 395, 151).

Phosphorescent materials of cyclometalated platinum (II) complexes studied in the early stage are mostly organic metal molecules containing bidentate and tridentate ligands. The organic metal molecules have low rigidity. The bidentate ligand is easy to twist and vibrate, resulting in low phosphorescence quantum efficiency (Inorg. Chem. 2002, 41, 3055). Cyclometalated platinum (II) complexes containing tridentate ligands have reduced electrochemical stability, photochemical stability and thermal stability since molecules each require a second ligand (such as $Cl^-$, a phenoxy anion, an alkyne anion, carbine, etc.). Therefore, the phosphorescent materials of cyclometalated platinum (II) complexes containing bidentate and tridentate ligands are not conducive to the preparation of stable and efficient OLED devices, especially difficult to meet the requirement for commercializing phosphorescent materials. Therefore, how to design and develop stable and efficient phosphorescent materials is still the key content in the field of OLEDs.

SUMMARY

An object of embodiments of the present disclosure is to provide a tetradentate cyclometalated platinum (II) complex based on oxygen atom linkage and containing phenyl acridine and an application thereof, so as to improve the molecular stability of an existing phosphorescent material. The molecules of the complex can emit light strongly, have good stability, and can be used as light-emitting materials in OLED devices.

To achieve the preceding object, the present disclosure provides the technical solutions described below.

In a first aspect, an embodiment of the present disclosure provides a tetradentate cyclometalated platinum (II) complex based on oxygen atom linkage and containing phenyl acridine, where the tetradentate cyclometalated platinum (II) complex has a structure of general formula (I):

(I)

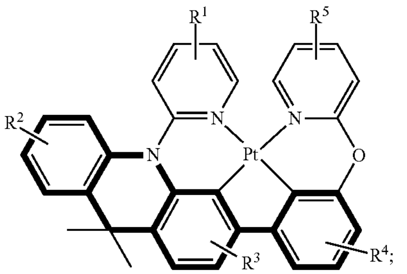

wherein, $R^1$, $R^2$, $R^3$, $R^4$ and $R^5$ each independently represent a mono-substitution, a di-substitution, a tri-substitution, a tetra-substitution or a non-substitution, and $R^1$, $R^2$, $R^3$, $R^4$ and $R^5$ are each independently hydrogen, deuterium, alkyl, aryl, cycloalkyl, heterocyclyl, heteroaryl or a combination thereof; and two or more adjacent ones of $R^1$, $R^2$, $R^3$, $R^4$ and $R^5$ are each independently or selectively linked to form a fused ring.

In a second aspect, an embodiment of the present disclosure further provides an organic light-emitting element including a light-emitting layer containing the tetradentate cyclometalated platinum (II) complex according to the first aspect on a substrate.

According to the preceding technical solutions, the complex uses a tetradentate ligand, has high rigidity, and can improve the light stability of a light-emitting material. Moreover, the molecules of the complex can emit light strongly and thus can be used as the light-emitting materials in the OLED devices.

BRIEF DESCRIPTION OF DRAWINGS

To illustrate the technical solutions in embodiments of the present disclosure more clearly, the accompanying drawings used in the embodiments are briefly described below.

DETAILED DESCRIPTION

Figure 1:
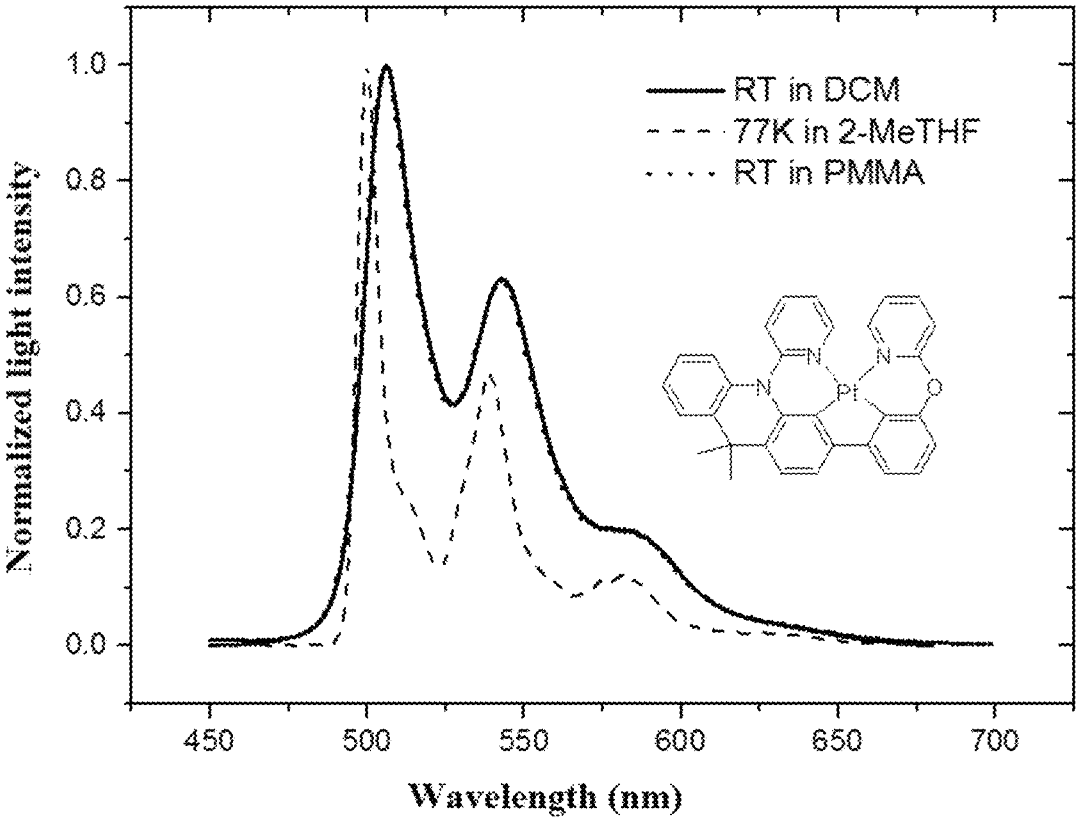
FIG. 1 shows the emission spectrum of a platinum complex Pt1 at room temperature in a DCM solution and PMMA and the emission spectrum of the platinum complex Pt1 at 77K in 2-MeTHF according to an embodiment of the present disclosure. DCM, PMMA and 2-MeTHF are dichloromethane, polymethyl methacrylate and 2-methyltetrahydrofuran, respectively.

A compound of the present disclosure may contain an "optionally substituted" moiety. Generally, the term "substituted" (regardless of whether there exists the term "optionally" preceding the term "substituted" or not) means that one or more hydrogens of the indicated moiety are replaced with suitable substituents. Unless otherwise specified, an "optionally substituted" group may have a suitable substituent at any substitutable position of the group, and when more than one substituent selected from specified groups are present at more than one position of any given structure, the substituents at these positions may be the same or different. A substituent combination contemplated by the present disclosure preferably includes those forming a stable or chemically feasible compound. In certain aspects, unless the contrary is clearly indicated, it is also included that each substituent may be further optionally substituted (that is, further substituted or unsubstituted).

The structure of the compound may be represented by the following formula:

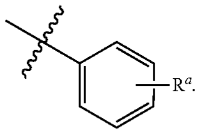

The formula is construed as being equivalent to the following formula:

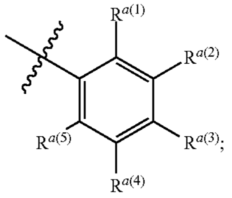

wherein m is generally an integer. That is, $(R^a)_m$ is construed as representing five independent substituents $R^{a(1)}$, $R^{a(2)}$, $R^{a(3)}$, $R^{a(4)}$ and $R^{a(5)}$.

A method for preparing a new compound is provided in the following examples, but the preparation of such compounds is not limited to the method. In the technical field, since the compound as claimed in this patent is easy to modify and prepare, the compound may be prepared by the methods listed below or other methods. The following examples are merely illustrative and not intended to limit the protection scope of this patent. The temperature, catalyst, concentration, reactants and reaction process may all be varied, so as to prepare the compound using different reactants and selecting different conditions.

The $^1H$ NMR (500 MHz) spectrum is measured on an ANANCE III (500 M) nuclear magnetic resonance spectrometer. Unless otherwise specified, DMSO-$d_6$ or $CDCl_3$ that contains 0.1% TMS is used as a solvent for nuclear magnetic resonance. If the $^1H$ NMR spectrum is measured with $CDCl_3$ as the solvent, TMS (δ=0.00 ppm) is used as an internal standard. When DMSO-$d_6$ is used as the solvent, TMS (δ=0.00 ppm) or a residual DMSO peak (δ=2.50 ppm) or a residual water peak (δ=3.33 ppm) is used as the internal standard. For the $^{13}C$ NMR spectrum, $CDCl_3$ (δ=77.00 ppm) or DMSO-$d_6$ (δ=39.52 ppm) is used as the internal standard. In $^1H$ NMR spectral data, s=singlet; d=doublet; t=triplet; q=quartet; p=quintet; m=multiplet; br=broad.

Synthesis Example of a tetradentate cyclometalated platinum (II) complex based on oxygen atom linkage and containing phenyl acridine.

The complex may be prepared with reference to the following synthesis method:

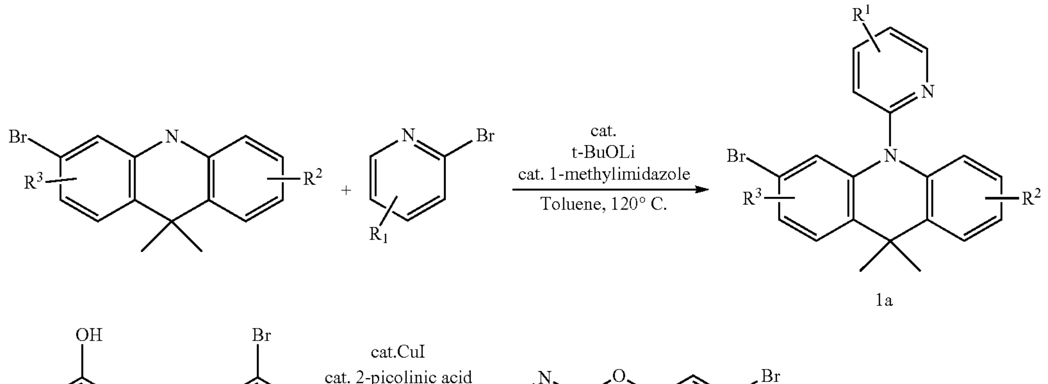

1a

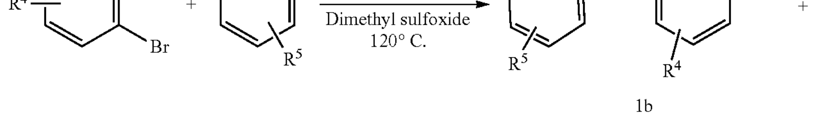

1b

-continued

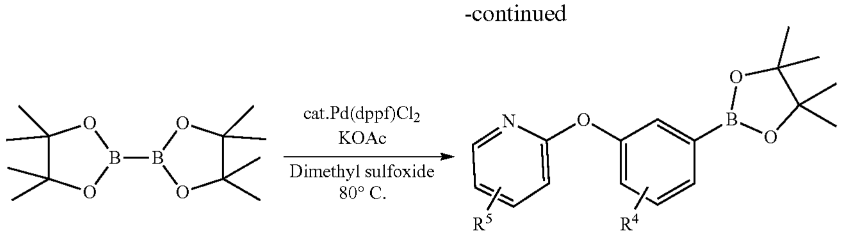

1c

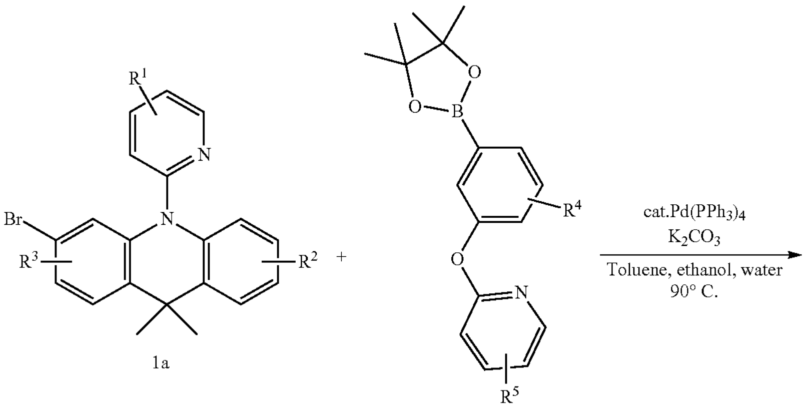

1a

1c

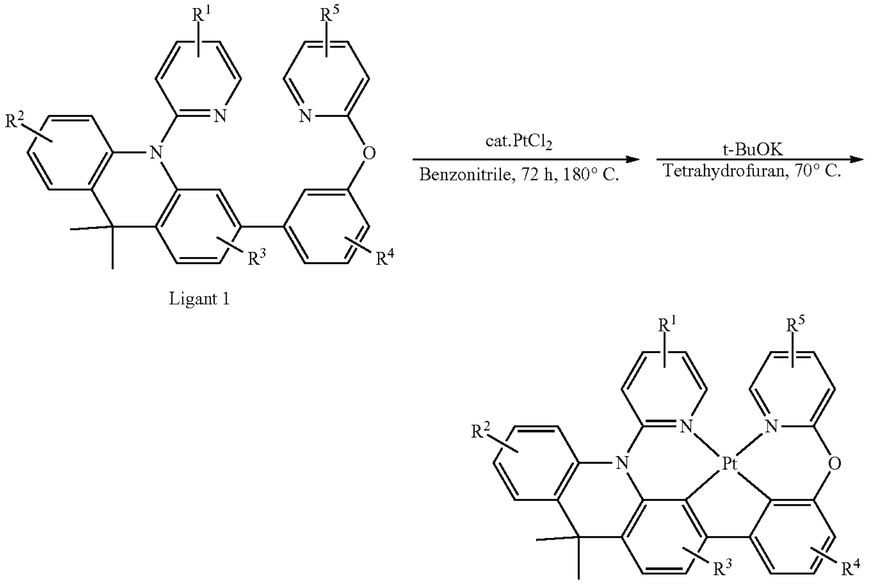

Ligant 1

It is to be understood that the product of the preceding synthesis method is not limited, $R^1$, $R^2$, $R^3$, $R^4$ and $R^5$ each independently represent a mono-substitution, a di-substitution, a tri-substitution, a tetra-substitution or a non-substitution, and $R^1$, $R^2$, $R^3$, $R^4$ and $R^5$ are each independently hydrogen, deuterium, alkyl, aryl, cycloalkyl, heterocyclyl, heteroaryl or a combination thereof; and two or more adjacent ones of $R^1$, $R^2$, $R^3$, $R^4$ and $R^5$ are each independently or selectively linked to form a fused ring. A feeding sequence and specific reaction conditions are not limited, such as the temperature, the type and consumption of a solvent, the type and consumption of a catalyst, the type and consumption of a ligand, the type and consumption of a base and the consumption of a reaction substrate. Those skilled in the art can easily make reasonable extensions from the examples in the embodiments of the present disclosure. Other groups are defined as in general formula (I).

Example 1: A Platinum Complex Pt1 May be Synthesized According to the Following Route

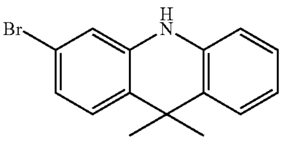

+

-continued

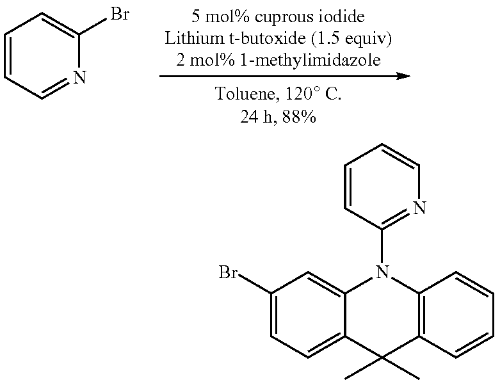

1a

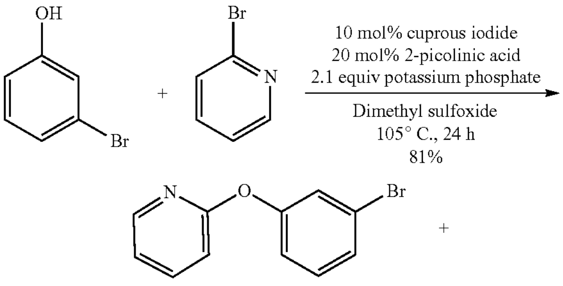

1b

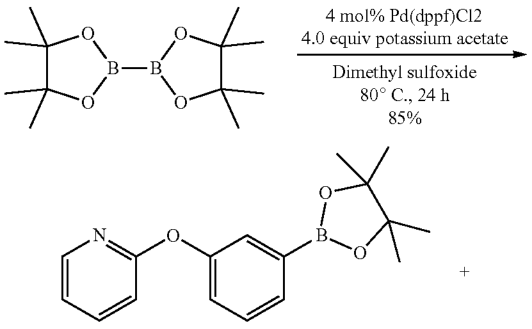

1c

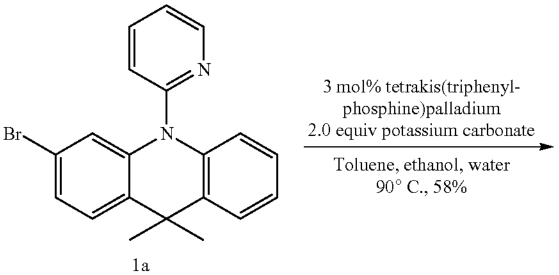

1a

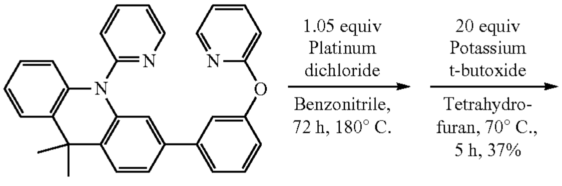

Ligand 1

-continued

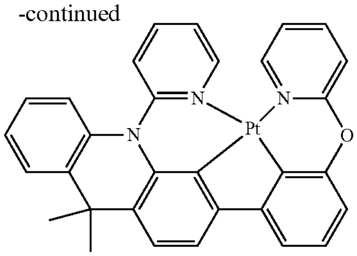

Pt1

Synthesis of Intermediate 1a: 3-bromo-9,9-dimethyl-9,10-dihydroacridine (2.88 g, 10.00 mmol, 1.00 equiv), 2-bromopyridine (1.74 g, 11.00 mmol, 1.10 equiv), cuprous iodide (95 mg, 0.50 mmol, 0.05 equiv), lithium t-butoxide (1.20 g, 15.00 mmol, 1.50 equiv) and 1-methylimidazole (16 mg, 0.20 mmol, 0.02 equiv) were sequentially added into a dry three-necked flask with a magnetic stirring rotor, and then the flask was purged with nitrogen three times, and added with toluene (25 mL) under nitrogen protection. The mixture was stirred and reacted in an oil bath of 120° C. for 24 h, cooled to room temperature, and distilled under reduced pressure to remove the solvents. The obtained crude product was separated and purified through silica gel column chromatography (eluents: petroleum ether/ethyl acetate=50:1-10:1) to obtain Product 1e as a white solid (3.20 g, yield: 88%). $^1H$ NMR (500 MHz, $CDCl_3$): δ 1.65 (s, 6H), 6.73 (dd, J=8.0, 1.5 Hz, 1H), 6.79 (d, J=2.0 Hz, 1H), 7.00 (td, J=7.5, 1.5 Hz, 1H), 7.03-7.07 (m, 1H), 7.08 (dd, J=8.0, 2.0 Hz, 1H), 7.24-7.26 (m, 1H), 7.27-7.29 (m, 1H), 7.42-7.45 (m, 2H), 7.78-7.81 (m, 1H), 8.65-8.66 (m, 1H).

Synthesis of Intermediate 1b: The m-bromophenol (8.65 g, 50.00 mmol, 1.00 equiv), 2-bromopyridine (11.85 g, 75.00 mmol, 1.50 equiv), cuprous iodide (952 mg, 5.00 mmol, 0.10 equiv), picolinic acid (1.23 g, 10.00 mmol, 0.20 equiv) and potassium phosphate (22.23 g, 105.00 mmol, 2.10 equiv) were sequentially added into a dry three-necked flask with a magnetic stirring rotor, and then the flask was purged with nitrogen three times, and added with dimethyl sulfoxide (40 mL) under nitrogen protection. The mixture was stirred and reacted in an oil bath of 105° C. for 24 h, cooled to room temperature, filtered with Celite, extracted with ethyl acetate, and washed with a solution of sodium carbonate. The organic layer was washed twice with water, the aqueous layer was extracted twice with ethyl acetate, and the organic phases were combined, dried over anhydrous sodium sulfate, filtered, and distilled under reduced pressure to remove the solvents. The obtained crude product was separated and purified through silica gel column chromatography (eluents: petroleum ether/ethyl acetate=100:1-20:1) to obtain Product 1b as a white solid (10.2 g, yield: 81%). $^1H$ NMR (500 MHz, $CDCl_3$): δ 7.08 (d, J=8.5 Hz, 1H), 7.14-7.18 (m, 2H), 7.36-7.43 (m, 3H), 7.86-7.90 (m, 1H), 7.08 (ddd, J=4.5, 2.0, 0.5 Hz, 1H).

Synthesis of Intermediate 1c: Intermediate 1b (4.00 g, 16.06 mmol, 1.00 equiv), bis(pinacolato)diboron (7.34 g, 28.90 mmol, 1.80 equiv), [1,1'-bis(diphenylphosphino)ferrocene]palladium dichloride (468 mg, 0.64 mmol, 0.04 equiv) and potassium acetate (6.30 g, 64.24 mmol, 4.00 equiv) were sequentially added into a dry three-necked flask with a magnetic stirring rotor, and then the flask was purged with nitrogen three times, and added with dimethyl sulfoxide (45 mL) under nitrogen protection. The mixture was stirred and reacted in an oil bath of 80° C. for 24 h, cooled to room temperature, and extracted with ethyl acetate. The organic layer was washed twice with water, the aqueous layer was extracted twice with ethyl acetate, and the organic phases were combined, dried over anhydrous sodium sulfate, filtered, and distilled under reduced pressure to remove the solvents. The obtained crude product was separated and purified through silica gel column chromatography (eluents: petroleum ether/ethyl acetate=20:1-10:1) to obtain Product 1c as a white solid (4.07 g, yield: 85%). $^1$H NMR (500 MHz, $CDCl_3$): δ 1.33 (s, 12H), 6.87-6.89 (m, 1H), 6.95-6.99 (m, 1H), 7.24 (ddd, J=4.0, 3.0, 1.5 Hz, 1H), 7.41 (t, J=7.5 Hz, 1H), 7.56 (dd, J=2.5, 1.0 Hz, 1H), 7.64-7.66 (m, 1H), 7.67-7.68 (m, 1H), 8.19 (ddd, J=3.0, 2.0, 1.0 Hz, 1H).

Synthesis of Ligand 1: Intermediate 1a (1.30 g, 3.57 mmol, 1.00 equiv), Intermediate 1c (1.17 g, 3.92 mmol, 1.10 equiv), tetrakis(triphenylphosphine)palladium (123 mg, 0.11 mmol, 0.03 equiv) and potassium carbonate (987 mg, 7.14 mmol, 2.00 equiv) were sequentially added into a dry three-necked flask with a magnetic stirring rotor, and then the flask was purged with nitrogen three times, and added with toluene (20 mL), ethanol (4 mL) and water (4 mL) under nitrogen protection. The mixture was stirred and reacted in an oil bath of 90° C. for 24 h, cooled to room temperature, and distilled under reduced pressure to remove the solvents. The obtained crude product was separated and purified through silica gel column chromatography (eluents: petroleum ether/ethyl acetate=10:1-5:1) to obtain the product Ligand 1 as a white solid (0.95 g, yield: 58%). $^1$H NMR (500 MHz, $CDCl_3$): δ 1.70 (s, 6H), 6.76 (dd, J=8.0, 1.0 Hz, 1H), 6.90 (dt, J=1.5, 0.5 Hz, 1H), 6.97 (d, J=2.0 Hz, 1H), 7.00 (m, 2H), 7.05 (m, 2H), 7.06 (td, J=2.5, 1.0 Hz, 1H), 7.0-7.09 (m, 2H), 7.20-7.21 (m, 1H), 7.24-7.25 (m, 1H), 7.27-7.28 (m, 1H), 7.32-7.34 (dt, J=8.0, 1.0 Hz, 1H), 7.36-7.39 (t, J=8.0 Hz, 1H), 7.46 (dd, J=7.5, 1.5 Hz, 1H), 7.50 (d, J=8.0 Hz, 1H), 7.65-7.69 (m, 1H), 7.82 (ddd, J=8.0, 7.5, 2.0 Hz, 1H), 8.19 (ddd, J=2.5, 2.0, 0.5 Hz, 1H), 8.67-8.69 (m, 1H).

Synthesis of Pt1: An intermediate Ligand 1 (200 mg, 0.44 mmol, 1.00 equiv) and platinum dichloride (127 mg, 0.48 mmol, 1.05 equiv) were sequentially added into a dry three-necked flask with a magnetic stirring rotor, and then the flask was purged with nitrogen three times, and added with benzonitrile (30 mL) under nitrogen protection. The mixture was stirred and reacted in a heating mantle of 180° C. for 72 h, cooled to room temperature, added with potassium t-butoxide (948 mg, 8.8 mmol, 20 equiv) and tetrahydrofuran (20 mL) under nitrogen protection, warmed to 70° C., and reacted for 3 h. The mixture was cooled to room temperature and distilled under reduced pressure to remove the solvents. The obtained crude product was separated and purified through silica gel column chromatography (eluents: petroleum ether/dichloromethane=3:1-1:1) to obtain Product Pt1 as a yellow solid (104 mg, yield: 37%). $^1$H NMR (500 MHz, DMSO-$d_6$): δ 1.28 (s, 3H), δ1.85 (s, 3H), 6.77 (dd, J=8.0, 1.0 Hz, 1H), 6.93-6.99 (m, 2H), 7.12-7.14 (m, 2H), 7.19 (td, J=7.5, 1.5 Hz, 1H), 7.21-7.23 (m, 2H), 7.29 (dd, J=8.0, 1.5 Hz, 1H), 7.33-7.35 (m, 1H), 7.44 (d, J=8.5 Hz, 1H), 7.49 (d, J=1.5 Hz, 1H), 7.54 (dd, J=7.5, 1.5 Hz, 1H), 7.94-7.98 (m, 1H), 8.17-8.21 (m, 1H), 8.61 (dd, J=7.5, 1.5 Hz, 1H), 8.67 (dd, J=6.0, 2.0 Hz, 1H).

Performance Evaluation Example of the Metal Pt (II) Complex

A photophysical analysis was performed on the complex prepared in the preceding example of the present disclosure below.

Photophysical analysis: An emission spectrum and an excited state lifetime were tested on a HORIBA FL3-11 spectrometer. Test conditions: The 2-methyltetrahydrofuran solid solution of the light-emitting material was used for testing the emission spectrum and the excited state lifetime at a low temperature; the dichloromethane solution of the light-emitting material was used for testing the emission spectrum and the excited state lifetime at room temperature; and a polymethyl methacrylate (PMMA) film was doped with a sample at a concentration of 5%.

The data on the photophysical properties of the tetradentate platinum complex Pt1 as a phosphorescent material is shown in Table 1 below.

TABLE 1

Data on the photophysical properties of the tetradentate platinum complex Pt1 as the phosphorescent material

| | Emission Spectrum at 77 K (2-MeTHF Solution) | | Emission Spectrum at Room Temperature (Dichloromethane TotalSolution) | | | Emission Spectrum at Room Temperature (PMMA Film) | | |
|---|---|---|---|---|---|---|---|---|
| Complex | $\lambda_{max}$ [nm] | τ [μs] | $\lambda_{max}$ [nm] | τ [μs] | $\Phi_{PL}$ [%] | $\lambda_{max}$ [nm] | τ [μs] | $\Phi_{PL}$ [%] |
| Pt1 | 500 | 11.94 | 506 | 8.16 | 33 | 506 | 9.07 | 32 |

Note:

DCM is dichloromethane; 2-MeTHF is 2-methyltetrahydrofuran; PMMA is polymethyl methacrylate; λ is a wavelength; λmax is a maximum wavelength; τ is the excited state lifetime of the material; $\Phi_{PL}$ is phosphorescence quantum efficiency.

Four points can be seen from the data in Table 1. Firstly, the emission wavelength of the platinum complex Pt1 as the phosphorescent luminescent material is within a green light range in various environments, which is a very good green light-emitting material. Second, the platinum complex Pt1 as the phosphorescent material has a very short excited state lifetime (T) and has an excited state lifetime of shorter than or equal to 10 μs especially in the dichloromethane solution or the PMMA film at room temperature, and a short excited state lifetime is conducive to increasing a response speed of an OLED device using the platinum complex Pt1 as the light-emitting material and improving phosphorescence efficiency, which is beneficial for a use in the device. Thirdly, the quantum efficiency in the dichloromethane solution is 34%, indicating that the metal platinum complex emits light strongly. Fourthly, the maximum emission wavelength ($\lambda_{max}$) of the platinum complex Pt1 as the phosphorescent material shifts slightly under different environments and conditions. It can also be seen from FIG. 1 that the platinum complex Pt1 as the phosphorescent material has a very small $\lambda_{max}$ shift in the diagram illustrating the comparison of emission spectra obtained in 2-methyltetrahydrofuran at a low temperature (77 K), dichloromethane at room temperature and PMMA at room temperature, indicating that such materials have very high color stability of emitted light.

TABLE 2

| High-resolution mass spectrometry of the platinum complex Pt1 | | | | |
|---|---|---|---|---|
| Molecular Formula | Molecular Ion Peak | m/z | Calc m/z | Diff(ppm) |
| $C_{31}H_{23}N_3O$ $^{[195]}$Pt | $C_{31}H_{23}N_3NaO$ $^{[195]}$Pt | 671.1384 | 671.1381 | −0.45 |

The structure of the platinum complex Pt1 was verified by the high resolution and hydrogen spectrum of the molecule.

Figure 2:
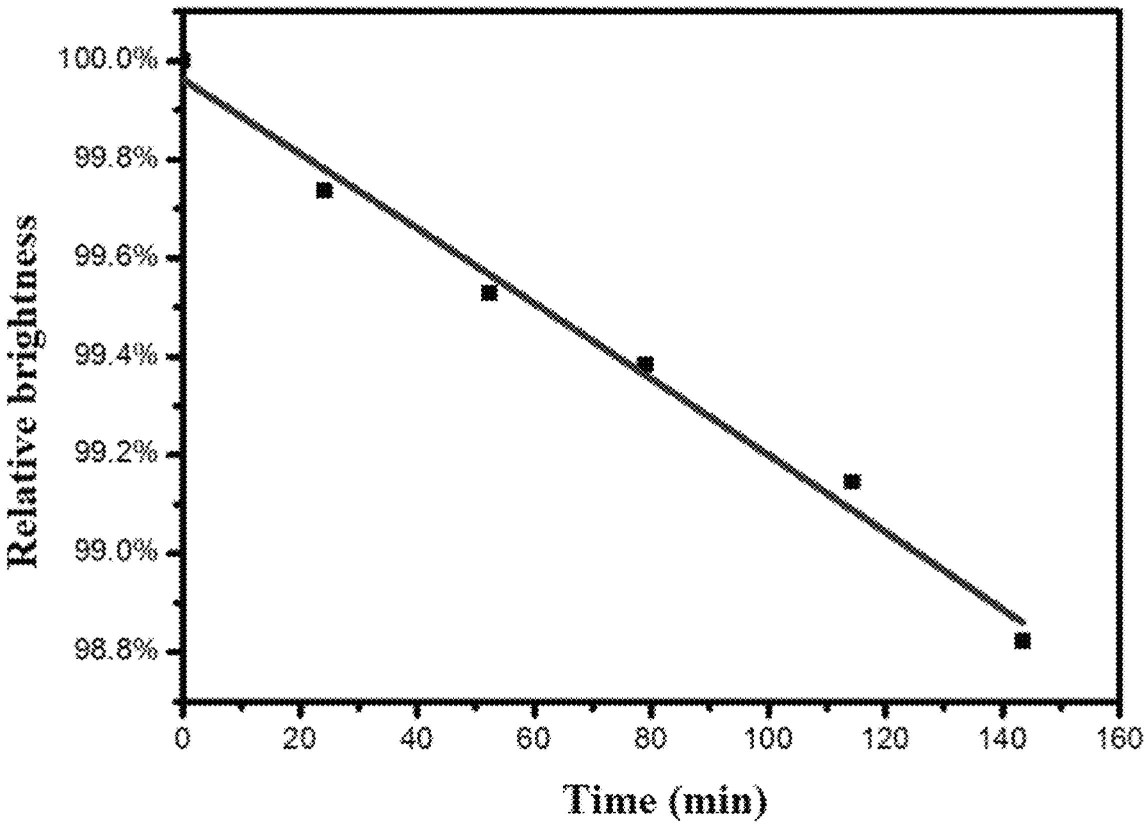
FIG. 2 shows the light stability test of a polystyrene film doped with a platinum complex Pt1 under the excitation of ultraviolet light at 375 nm and with a light intensity of 500 $W/m^2$.

To investigate the stability of the developed material, the light stability of a polystyrene film doped with 5 wt % Pt1 was tested, where an excitation light source was ultraviolet light at 375 nm and a light intensity was 500 $W/m^2$. The data on its light stability is shown in FIG. 2. Moreover, Pt1 was compared with cyclometalated platinum (II) complexes Pt(bp-2), Pt(bp-3), Pt(bp-4) and Pt(bp-5) which were reported in the literature (Inorganic Chemistry, 2020, 59, 3718.) and whose structures are shown below. Pt(bp-2), Pt(bp-3), Pt(bp-4) and Pt(bp-5) were tested under the same conditions as Pt1 for their light stability data.

Pt(bp-2)

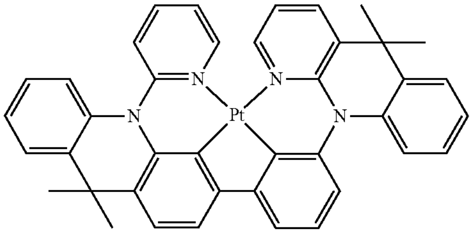

Pt(bp-3)

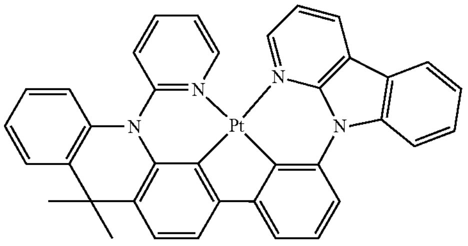

Pt(bp-4)

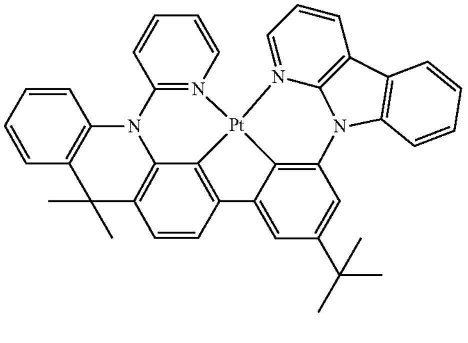

-continued

Pt(bp-5)

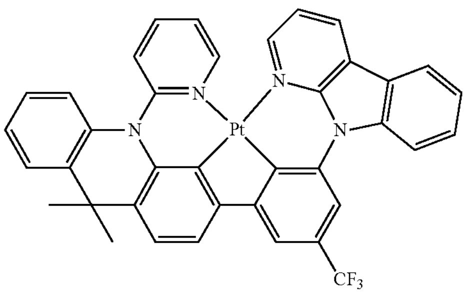

As can be seen from FIG. 2, the (Pt1:polystyrene) film having 5% the phosphorescent material has excellent light stability under excitation of ultraviolet light at 375 nm (with a light intensity of 500 $W/m^2$) and it takes 120 minutes for the intensity to decay by 1%.

Figure 3:
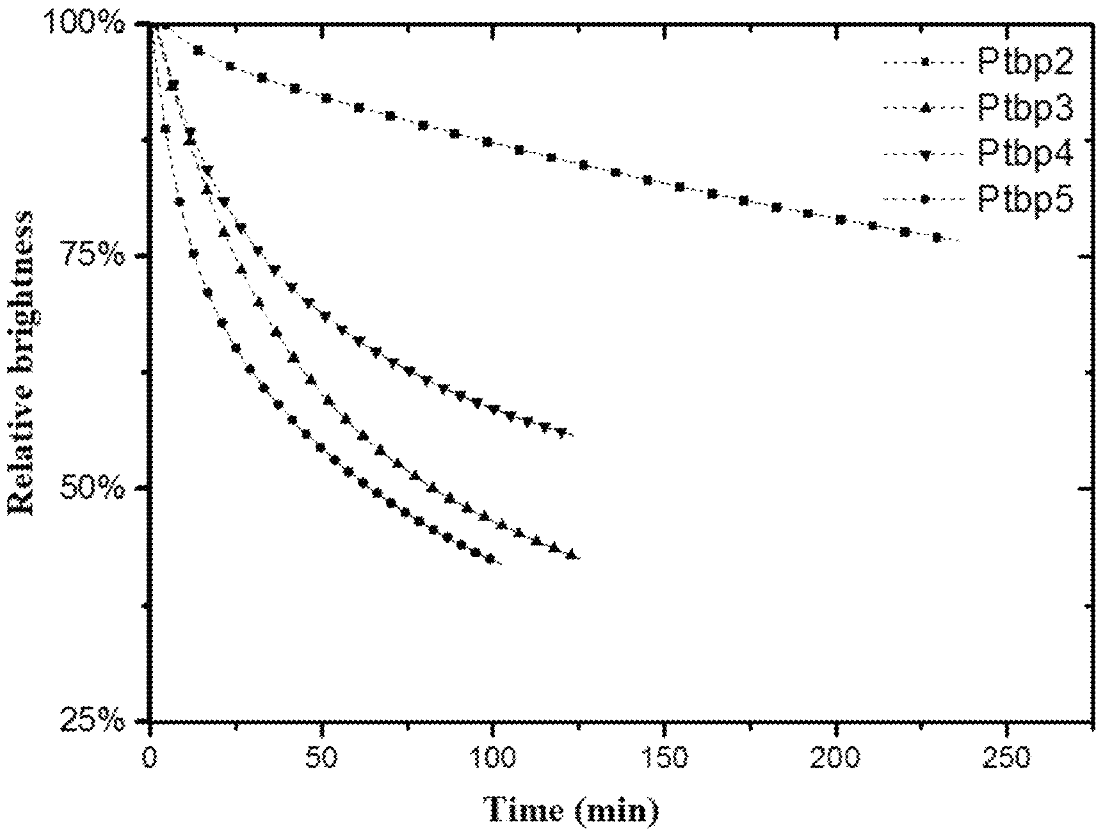
FIG. 3 shows the light stability test of polystyrene films doped with platinum complexes Pt(bp-2), Pt(bp-3), Pt(bp-4) and Pt(bp-5) under the excitation of ultraviolet light at 375 nm and with a light intensity of 500 $W/m^2$.

It can be seen from the comparison between FIG. 2 and FIG. 3 that under the same conditions, Pt1 decays by 1% after 2 hours, Pt(bp-2) decays by about 15% after 2 hours, and Pt(bp-3), Pt(bp-4) and Pt(bp-5) decay by about 40% to 60% after 2 hours in the light stability test. It can be seen that Pt1 based on oxygen atom linkage, which is developed in the present application, has much higher light stability than the tetradentate metal Pt (II) complexes based on nitrogen atom linkage in the preceding literature.

Figure 4:
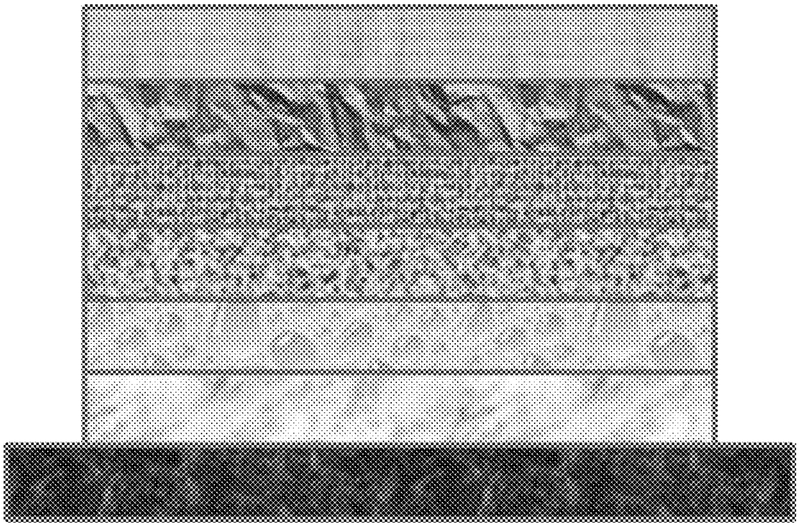
FIG. 4 is a structural diagram of a light-emitting element according to an embodiment.

An application of the tetradentate cyclometalated platinum (II) complex phosphorescent light-emitting material of the present disclosure as a light-emitting layer of an organic electroluminescent device. In an organic light-emitting element, carriers are injected into the light-emitting material from positive and negative electrodes so that the light-emitting material is in an excited state and emits light. The complex of the present disclosure represented by general formula (I) may be applied as the phosphorescent material to an excellent organic light-emitting element such as an organic photoluminescent element or an organic electroluminescent element. The organic photoluminescent element has a structure in which at least a light-emitting layer is formed on a substrate. In addition, the organic electroluminescent element has a structure in which at least an anode, a cathode and an organic layer between the anode and the cathode are formed. The organic layer includes at least the light-emitting layer and may be composed of only the light-emitting layer or may have one or more organic layers in addition to the light-emitting layer. As such other organic layers, a hole transport layer, a hole injection layer, an electron blocking layer, a hole blocking layer, an electron injection layer, an electron transport layer, an exciton blocking layer and the like may be listed. The hole transport layer may also be a hole injection and transport layer having a hole injection function, and the electron transport layer may also be an electron injection and transport layer having an electron injection function. The structural diagram of a specific organic light-emitting element is shown in FIG. 4. In FIG. 4, there are 7 layers from bottom to top, which represent the substrate, the anode, the hole injection layer, the hole transport layer, the light-emitting layer, the electron transport layer and the cathode in sequence, where the light-emitting layer is a mixed layer in which a guest material doped into a host material.

The compound shown in Example 1 was applied as the phosphorescent material to an OLED device whose structure was expressed as follows:

ITO/HATCN (10 nm)/TAPC (65 nm)/CBP: the compound shown in Example 1 (10-20 wt. %, 20 nm)/$Bepp_2$ (10 nm)/$Li_2CO_3$:$Bepp_2$ (5%, 30 nm)/$Li_2CO_3$ (1 nm)/Al (100 nm).

ITO is a transparent anode, HATCN is the hole injection layer, TCTA is the hole transport layer, CBP is the host material, the compound shown in Example 1 (10-20 wt. % is a doping concentration, 20 nm is a thickness of the light-emitting layer) is the guest material, $Bepp_2$ is the electron transport layer, $Li_2CO_3$ is the electron injection layer, and Al is the cathode. Numbers with nanometer (nm) unit in parentheses are the thicknesses of the films.

It is to be noted that the structure is an application example of the light-emitting material of the present disclosure and not to limit the specific structure of the OLED device using the light-emitting material of the present disclosure, and the phosphorescent material is not limited to the compound shown in Example 1.

The molecular formulas of the materials used in the device are as follows:

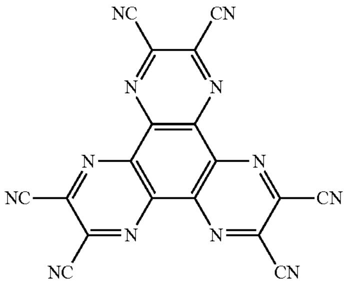

HATCN

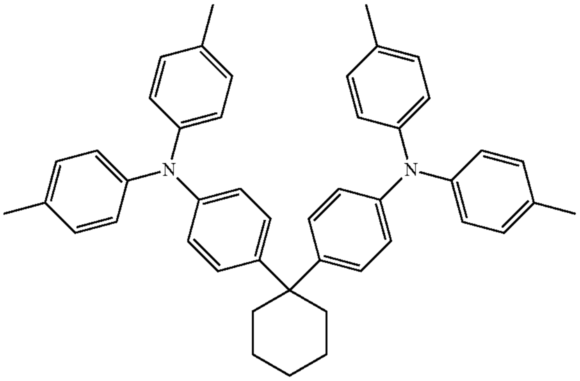

TAPC

-continued

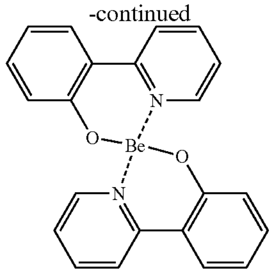

$Bepp_2$

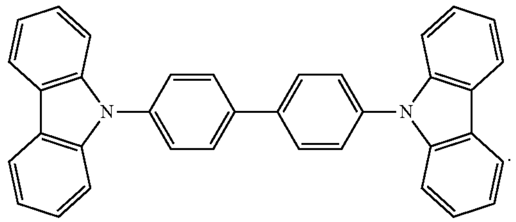

CBP

It is to be understood by those skilled in the art that the preceding embodiments are specific examples of implementation of the present disclosure, and in practical applications, various changes in form and details can be made without departing from the spirit and the scope of the present disclosure. For example, many substituent structures described herein may be replaced with other structures without departing from the spirit of the present disclosure.

What is claimed is:

1. A tetradentate cyclometalated platinum (II) complex based on oxygen atom linkage and containing phenyl acridine, wherein the tetradentate cyclometalated platinum (II) complex has a structure of general formula (I):

(I)

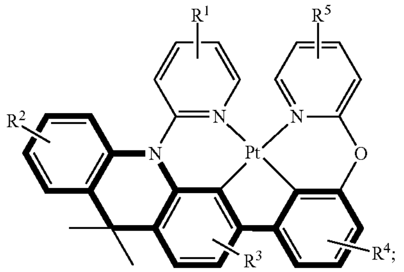

wherein $R^1$, $R^2$, $R^3$, $R^4$ and $R^5$ each independently represent a mono-substitution, a di-substitution, a tri-substitution, a tetra-substitution or a non-substitution, and $R^1$, $R^2$, $R^3$, $R^4$ and $R^5$ are each independently selected from the group consisting of hydrogen, deuterium, alkyl, aryl, cycloalkyl, heterocyclyl, heteroaryl and a combination thereof; and optionally two or more adjacent ones of $R^1$, $R^2$, $R^3$, $R^4$ and $R^5$ are each independently linked to form a fused ring.

2. An organic light-emitting element, comprising a light-emitting layer containing the tetradentate cyclometalated platinum (II) complex according to claim 1 on a substrate.

* * * * *